(12) United States Patent
Fridman et al.

(10) Patent No.: US 12,237,192 B2
(45) Date of Patent: Feb. 25, 2025

(54) MINI-ENVIRONMENT SYSTEM FOR CONTROLLING OXYGEN AND HUMIDITY LEVELS WITHIN A SAMPLE TRANSPORT DEVICE

(71) Applicant: KLA Corporation, Milpitas, CA (US)

(72) Inventors: Alexander Fridman, Haifa (IL); Tzachi Pressburger, Kfar HaHoresh (IL); Herman Vilenchik, Migdal Haemek (IL); Arthur Kalman, Migdal Haemek (IL)

(73) Assignee: KLA Corporation, Milpitas, CA (US)

( * ) Notice: Subject to any disclaimer, the term of this patent is extended or adjusted under 35 U.S.C. 154(b) by 457 days.

(21) Appl. No.: 17/223,362

(22) Filed: Apr. 6, 2021

(65) Prior Publication Data

US 2021/0327736 A1   Oct. 21, 2021

Related U.S. Application Data

(60) Provisional application No. 63/011,302, filed on Apr. 17, 2020.

(51) Int. Cl.
| | | |
|---|---|---|
| *H01L 21/673* | (2006.01) | |
| *G01N 1/28* | (2006.01) | |
| *G01N 1/00* | (2006.01) | |

(52) U.S. Cl.
CPC ......... *H01L 21/67389* (2013.01); *G01N 1/28* (2013.01); *G01N 2001/002* (2013.01)

(58) Field of Classification Search
CPC ......... H01L 21/67389; H01L 21/67772; H01L 21/67775; H01L 21/67126; G01N 1/28; G01N 2001/002

USPC ............ 73/863, 864.83, 864.91, 431, 432.1; 206/730, 731, 701, 710–712; 63/265, 63/457.1

See application file for complete search history.

(56) References Cited

U.S. PATENT DOCUMENTS

| | | |
|---|---|---|
| 9,437,466 B2 | 9/2016 | Sakiya et al. |
| 2009/0175709 A1 | 7/2009 | Okabe et al. |
| | (Continued) | |

FOREIGN PATENT DOCUMENTS

| | | | | |
|---|---|---|---|---|
| CN | 100458515 C | * | 2/2009 | ....... H01L 21/67196 |
| CN | 101409220 A | * | 4/2009 | ....... H01L 21/67017 |
| | (Continued) | | | |

OTHER PUBLICATIONS

PCT International Search Report and Written Opinion for International Application No. PCT/US2021/026938 dated Aug. 6, 2021, 12 pages.

*Primary Examiner* — Robert R Raevis
(74) *Attorney, Agent, or Firm* — Suiter Swantz IP

(57) ABSTRACT

A mini-environment apparatus is disclosed. The apparatus may include an enclosure including a frame with two or more openings. The frame may define an internal cavity within the enclosure. The apparatus may include a flapper blade coupled to a portion of the frame. The flapper blade may be configured to close at least one opening of the two or more openings of the frame to form a sealed enclosure when the flapper blade is in a closed position. The apparatus may include a floating plate coupled to a portion of the frame. The floating plate may include one or more slots. The apparatus may include one or more shutters coupled a portion of the floating plate to cover the one or more slots.

29 Claims, 16 Drawing Sheets

(56) References Cited

U.S. PATENT DOCUMENTS

| | | |
|---|---|---|
| 2013/0336749 A1 | 12/2013 | Gilchrist et al. |
| 2019/0295874 A1 | 9/2019 | Bieli et al. |
| 2020/0035531 A1 | 1/2020 | Doyle et al. |

FOREIGN PATENT DOCUMENTS

| | | | |
|---|---|---|---|
| CN | 20200142846 A | * | 12/2020 |
| JP | 2000012670 A | | 1/2000 |
| WO | 2019203270 A1 | | 10/2019 |

* cited by examiner

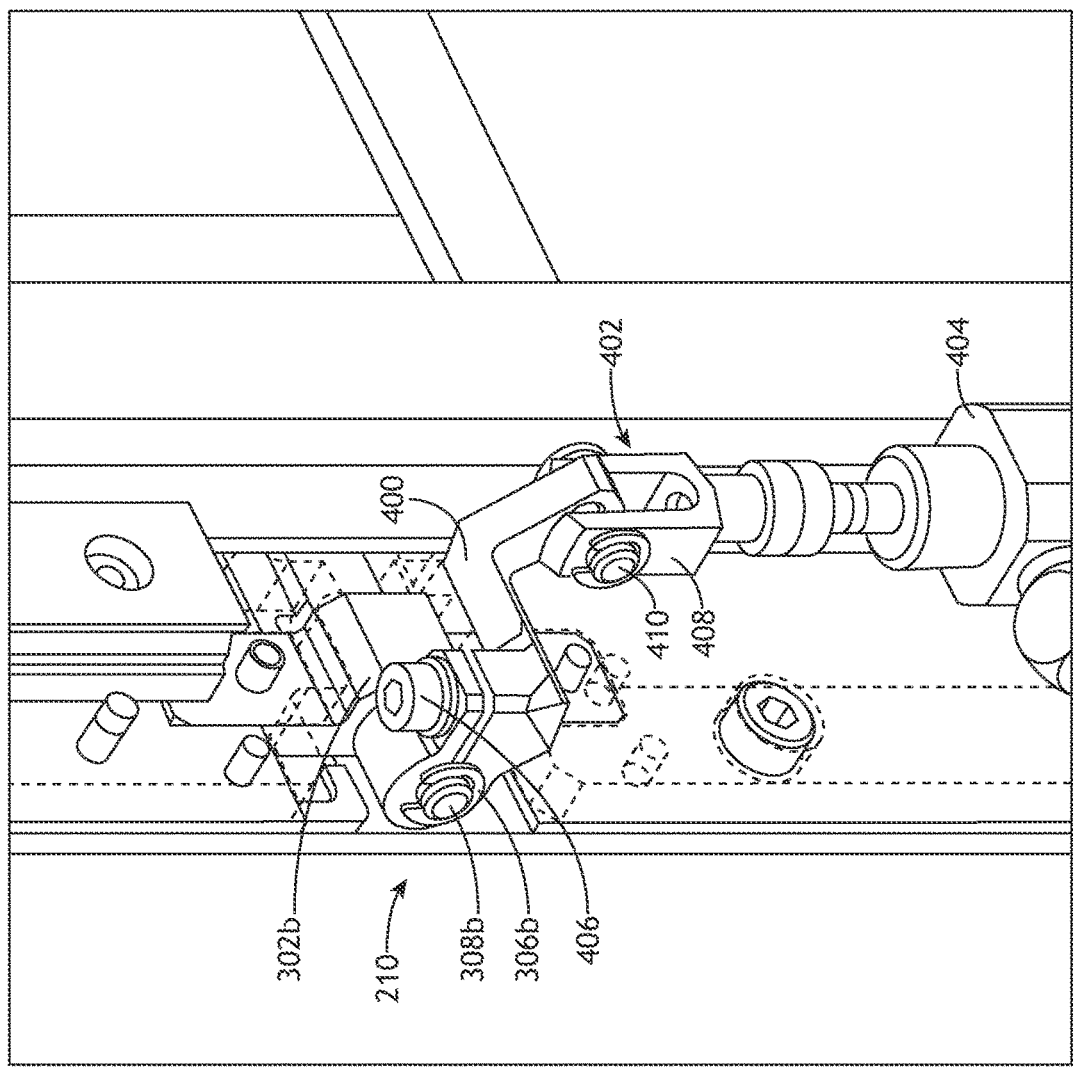

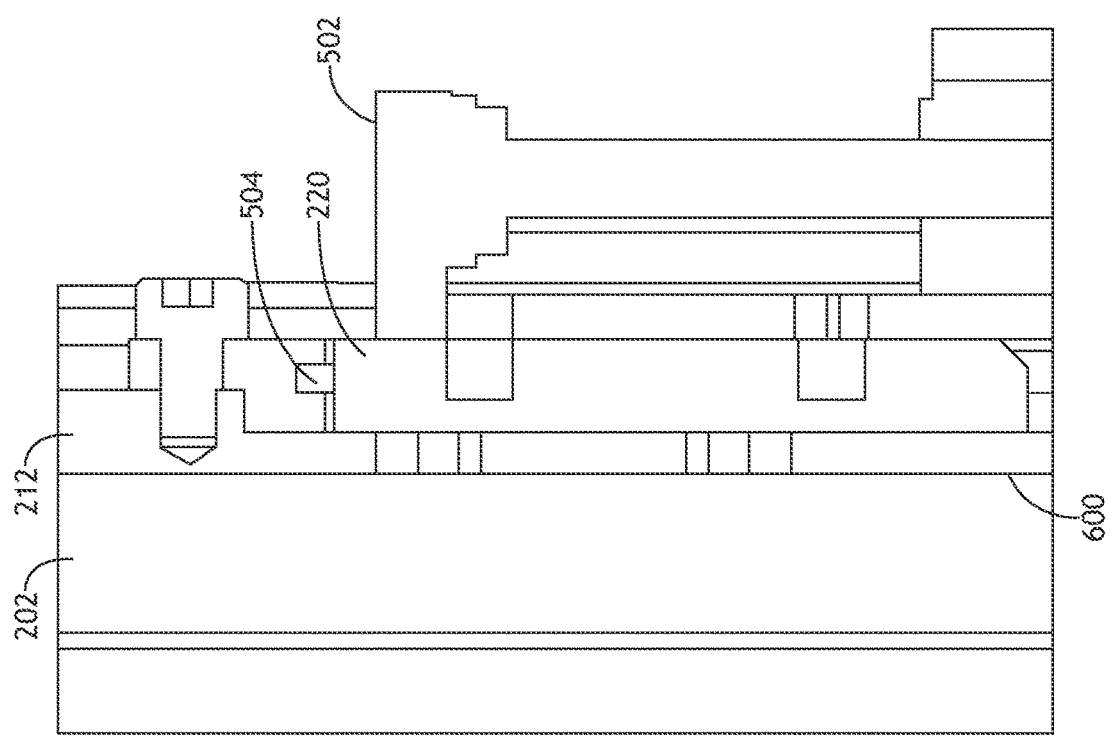

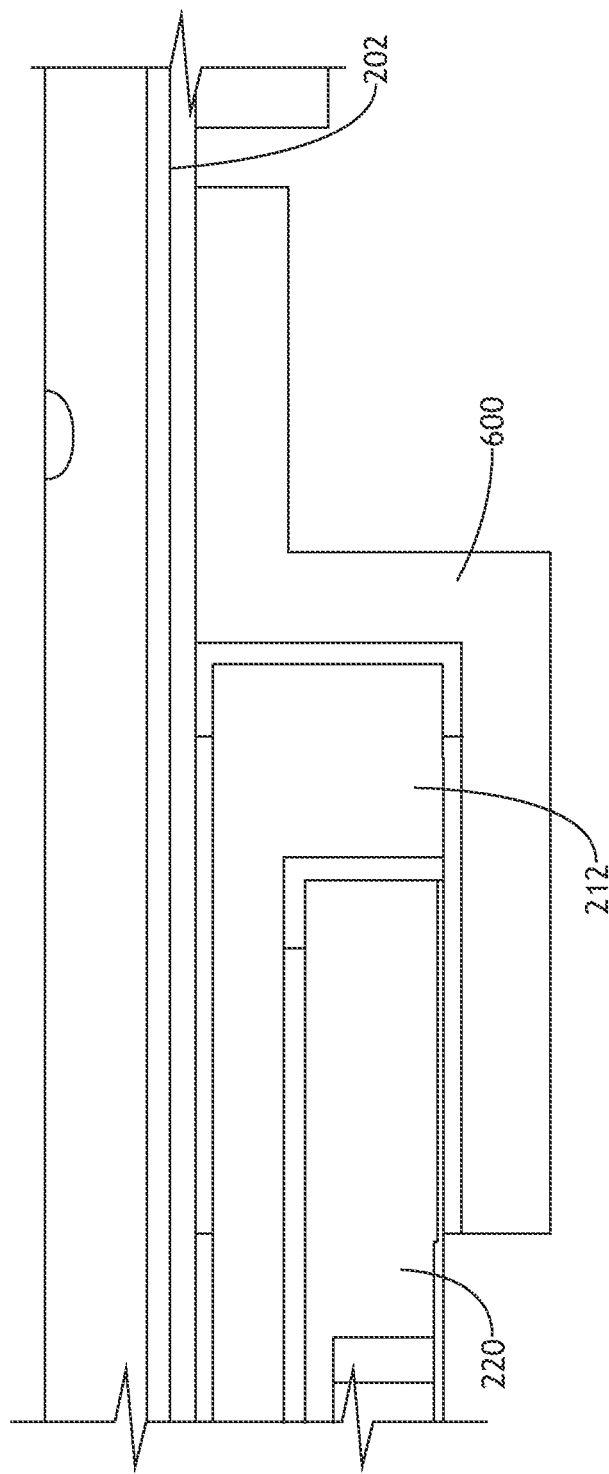

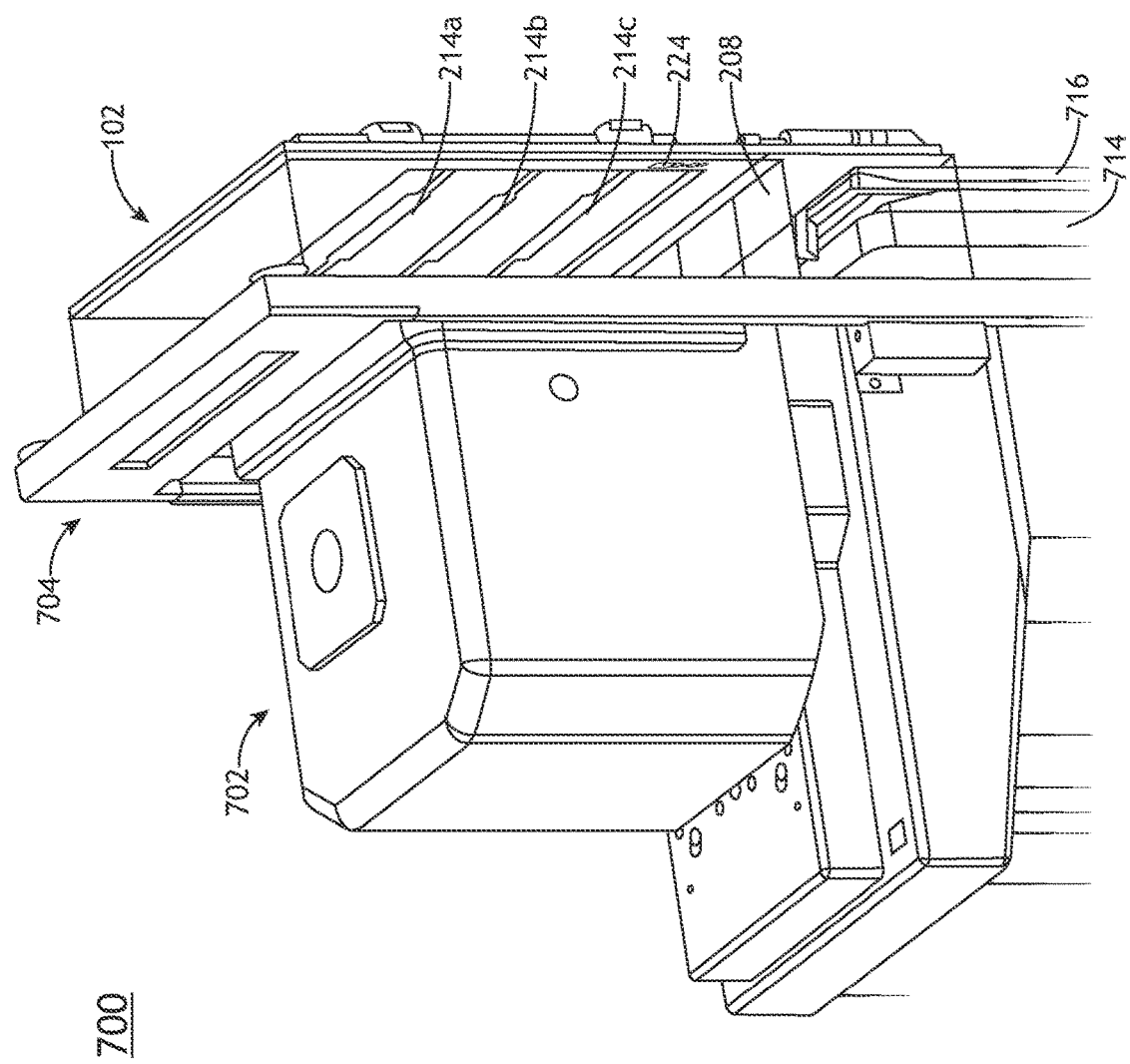

MINI-ENVIRONMENT SYSTEM FOR CONTROLLING OXYGEN AND HUMIDITY LEVELS WITHIN A SAMPLE TRANSPORT DEVICE

CROSS-REFERENCE TO RELATED APPLICATION

The present application claims benefit under 35 U.S.C. § 119(e) and constitutes a regular (non-provisional) patent application of U.S. Provisional Application Ser. No. 63/011,302, filed Apr. 17, 2020, naming Alexander Fridman, Tzachi Pressburger, and Herman Vilenchik as inventors, which is incorporated herein by reference in the entirety.

TECHNICAL FIELD

The present invention generally relates to sample fabrication systems and, more particularly, to a mini-environment system for controlling oxygen and humidity levels within a sample transport device.

BACKGROUND

Process flows in modern semiconductor device fabrication lines utilize a multitude of fabrication steps performed by a series of semiconductor fabrication tools. For example, metrology tools and inspection tools may be used during the fabrication process to ensure that a certain yield is reached and maintained. Samples in a process flow are typically moved through the process steps in sealable sample transport devices, or front opening unified pods (FOUPs). When samples are loaded/unloaded into/from the FOUP, the samples may be exposed to ambient air, which may cause an oxide film to form on a surface of the sample. Existing methods allow for the FOUP to be purged prior to opening the load port door or after opening the load port door to minimize such oxidation defections. However, with these existing methods, it is difficult to maintain and/or control oxygen and humidity levels inside the FOUP when the FOUP is open. Therefore, there is a need for the ability to maintain and/or control oxygen and humidity levels inside the FOUP while extracting/retracting a sample from/into the FOUP to prevent remaining samples within the FOUP from being exposed to ambient air when the FOUP is open.

SUMMARY

A mini-environment apparatus is disclosed, in accordance with one or more embodiments of the present disclosure. In one embodiment, the apparatus includes an enclosure including a frame with two or more openings, the frame defining an internal cavity within the enclosure. In another embodiment, the apparatus includes a flapper blade coupled to a portion of the frame, the flapper blade configured to close at least one opening of the two or more openings of the frame to form a sealed enclosure when the flapper blade is in a closed position. In another embodiment, the apparatus includes a floating plate coupled to a portion of the frame, the floating plate including one or more slots. In another embodiment, the apparatus includes one or more shutters coupled a portion of the floating plate to cover the one or more slots.

A mini-environment control system is disclosed, in accordance with one or more embodiments of the present disclosure. In one embodiment, the system includes a mini-environment sub-system. In another embodiment, the mini-environment sub-system includes an enclosure including a frame with two or more openings, the frame defining an internal cavity within the enclosure. In another embodiment, the mini-environment sub-system includes a flapper blade coupled to a portion of the frame, the flapper blade configured to close at least one opening of the two or more openings of the frame to form a sealed enclosure when the flapper blade is in a closed position. In another embodiment, the mini-environment sub-system includes a flapper actuator assembly configured to actuate the flapper blade between the closed position and an open position, the flapper actuator assembly configured to actuate the flapper blade between an open position and the closed position. In another embodiment, the mini-environment sub-system includes a floating plate coupled to a portion of the frame, the floating plate including one or more slots. In another embodiment, the mini-environment sub-system includes a floating plate actuator assembly configured to adjust a position of the floating plate to align the one or more slots of the floating plate with a sample slot of a sample transport device. In another embodiment, the mini-environment sub-system includes one or more shutters coupled a portion of the floating plate to cover the one or more slots. In another embodiment, the mini-environment sub-system includes a shutter actuator assembly configured to one of open or close the one or more shutters when the one or more slots of the floating plate are aligned with the sample slot. In another embodiment, the system includes a controller communicatively coupled to the mini-environment sub-system, the controller including one or more processors configured to cause the one or more processors to: generate one or more flapper blade actuator control signals; provide the one or more flapper blade actuator control signals to the flapper actuator assembly to cause the flapper actuator assembly to actuate the flapper blade between the closed position and the open position; generate one or more floating plate actuator control signals; provide the one or more floating plate actuator control signals to the floating plate actuator assembly to cause the floating plate actuator assembly to adjust a position of the floating plate; generate one or more shutter actuator control signals; and provide the one or more shutter actuator control signals to the shutter actuator assembly to cause the shutter actuator to one of open or close the shutter.

A system is disclosed, in accordance with one or more embodiments of the present disclosure. In one embodiment, the system includes a sample transport device including a chamber for one or more samples. In another embodiment, the system includes a load port device configured to receive a portion of the sample transport device. In another embodiment, the system includes a mini-environment sub-system removably couplable to a portion of the load port device. In another embodiment, the mini-environment sub-system includes an enclosure including a frame with two or more openings, the frame defining an internal cavity within the enclosure. In another embodiment, the mini-environment sub-system includes a flapper blade coupled to a portion of the frame, the flapper blade configured to close at least one opening of the two or more openings of the frame to form a sealed enclosure when the flapper blade is in a closed position. In another embodiment, the mini-environment sub-system includes a floating plate coupled to a portion of the frame, the floating plate including one or more slots. In another embodiment, the mini-environment sub-system includes one or more shutters coupled a portion of the floating plate to cover the one or more slots.

A method is disclosed, in accordance with one or more embodiments of the present disclosure. In one embodiment, the method includes generating one or more flapper blade actuator control signals. In another embodiment, the method includes providing the one or more flapper blade actuator control signals to a flapper actuator to cause the flapper actuator to actuate a flapper blade between a closed position and an open position. In another embodiment, the method includes generating one or more floating plate actuator control signals. In another embodiment, the method includes providing the one or more floating plate actuator control signals to a floating plate actuator to cause the floating plate actuator to adjust a position of a floating plate. In another embodiment, the method includes generating one or more shutter actuator control signals. In another embodiment, the method includes providing the one or more shutter actuator control signals to a shutter actuator to cause the shutter actuator to one of open or close a shutter.

A method is disclosed, in accordance with one or more embodiments of the present disclosure. In one embodiment, the method includes loading a sample transport device with one or more samples. In another embodiment, the method includes opening a lid of the sample transport device using a load port door. In another embodiment, the method includes generating one or more flapper blade actuator control signals. In another embodiment, the method includes providing the one or more flapper blade actuator control signals to a flapper actuator to cause the flapper actuator to actuate a flapper blade between a closed position and an open position. In another embodiment, the method includes generating one or more floating plate actuator control signals. In another embodiment, the method includes providing the one or more floating plate actuator control signals to a floating plate actuator to cause the floating plate actuator to adjust a position of a floating plate to align a slot of the floating plate with a sample of the one or more samples of the sample transport device. In another embodiment, the method includes generating one or more shutter actuator control signals. In another embodiment, the method includes providing the one or more shutter actuator control signals to a shutter actuator to cause the shutter actuator to open a shutter corresponding to the sample of the one or more samples of the sample transport device. In another embodiment, the method includes extracting the sample from the sample transport device through the slot. In another embodiment, the method includes generating one or more additional shutter actuator control signals. In another embodiment, the method includes providing the one or more additional shutter actuator control signals to the shutter actuator to cause the shutter actuator to close the shutter.

A method is disclosed, in accordance with one or more embodiments of the present disclosure. In one embodiment, the method includes loading a sample transport device with one or more samples. In another embodiment, the method includes opening a lid of the sample transport device using a load port door. In another embodiment, the method includes generating one or more flapper blade actuator control signals. In another embodiment, the method includes providing the one or more flapper blade actuator control signals to a flapper actuator to cause the flapper actuator to actuate a flapper blade between a closed position and an open position. In another embodiment, the method includes generating one or more floating plate actuator control signals. In another embodiment, the method includes providing the one or more floating plate actuator control signals to a floating plate actuator to cause the floating plate actuator to adjust a position of a floating plate to align a slot of the floating plate with a sample of the one or more samples of the sample transport device. In another embodiment, the method includes generating one or more shutter actuator control signals. In another embodiment, the method includes providing the one or more shutter actuator control signals to a shutter actuator to cause the shutter actuator to open a shutter corresponding to the sample of the one or more samples of the sample transport device. In another embodiment, the method includes retracting the sample into the sample transport device through the slot. In another embodiment, the method includes generating one or more additional shutter actuator control signals. In another embodiment, the method includes providing the one or more additional shutter actuator control signals to the shutter actuator to cause the shutter actuator to close the shutter.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 4A illustrates an exploded view of a flapper actuator assembly, in accordance with one or more embodiments of the present disclosure.

FIG. 6A illustrates an exploded vertical cross-sectional view of the mini-environment sub-system, in accordance with one or more embodiments of the present disclosure.

FIG. 6C illustrates an exploded horizontal cross-sectional view of the mini-environment sub-system, in accordance with one or more embodiments of the present disclosure.

FIG. 7B illustrates a conceptual view of a system integrating the mini-environment sub-system, in accordance with one or more embodiments of the present disclosure.

DETAILED DESCRIPTION OF THE INVENTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to a mini-environment system for a sample transport device to control oxygen and humidity levels within the sample transport device. Specifically, embodiments of the present disclosure are directed to a closed mini-environment system configured to provide a closed and controlled oxygen-free and low humidity mini-environment during the period that a FOUP is open. This allows the samples to be extracted/retracted from/into the FOUP without damaging remaining samples within the FOUP.

Figure 1:
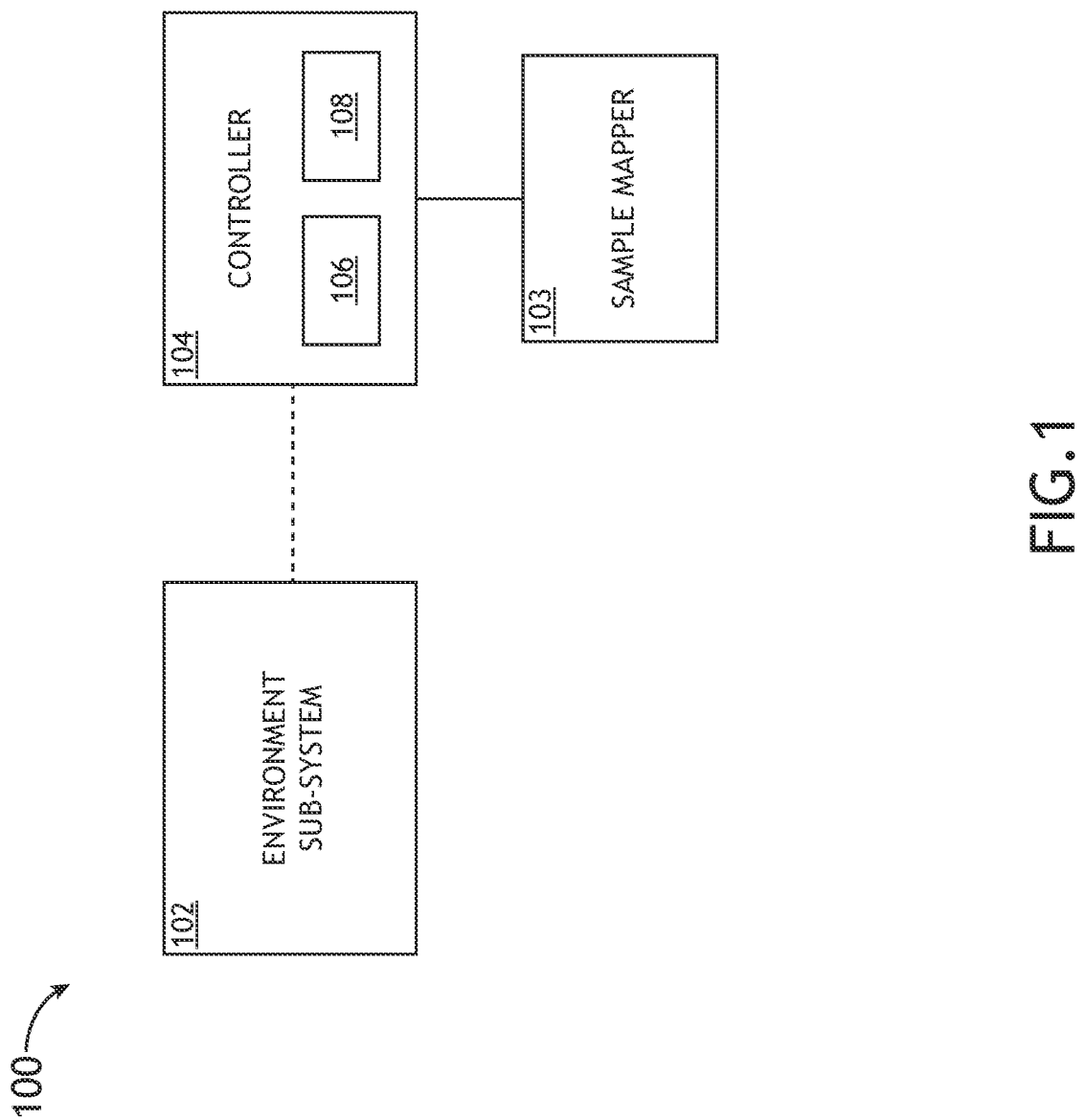
FIG. 1 illustrates a simplified block diagram of a mini-environment control system for controlling oxygen and humidity levels within a sample transport device, in accordance with one or more embodiments of the present disclosure.

FIG. 1 illustrates a simplified block diagram of the mini-environment control system 100, in accordance with one or more embodiments of the present disclosure.

In embodiments, the mini-environment control system 100 includes a mini-environment sub-system 102 communicatively coupled to a controller 104. The controller 104 may be configured to generate one or more control signals configured to cause one or more components of the mini-environment sub-system to adjust one or more characteristics of the mini-environment sub-system 102. For example, the controller 104 may be configured to cause a flapper blade to swivel between an open position and a closed position. By way of another example, the controller 104 may be configured to cause a floating plate and a corresponding shutter plate to translate a select distance to align with a desired sample or sample slot.

Figure 2A:
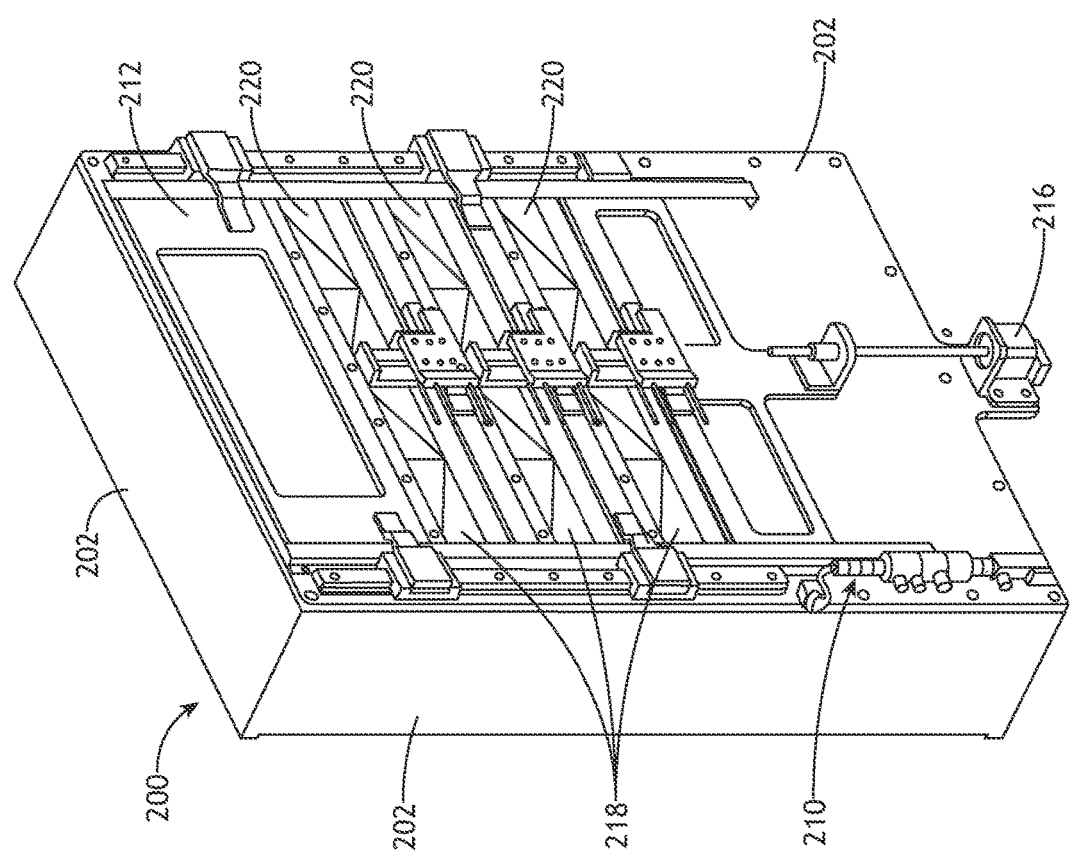
FIG. 2A illustrates a conceptual view of a mini-environment sub-system, in accordance with one or more embodiments of the present disclosure.
Figure 2B:
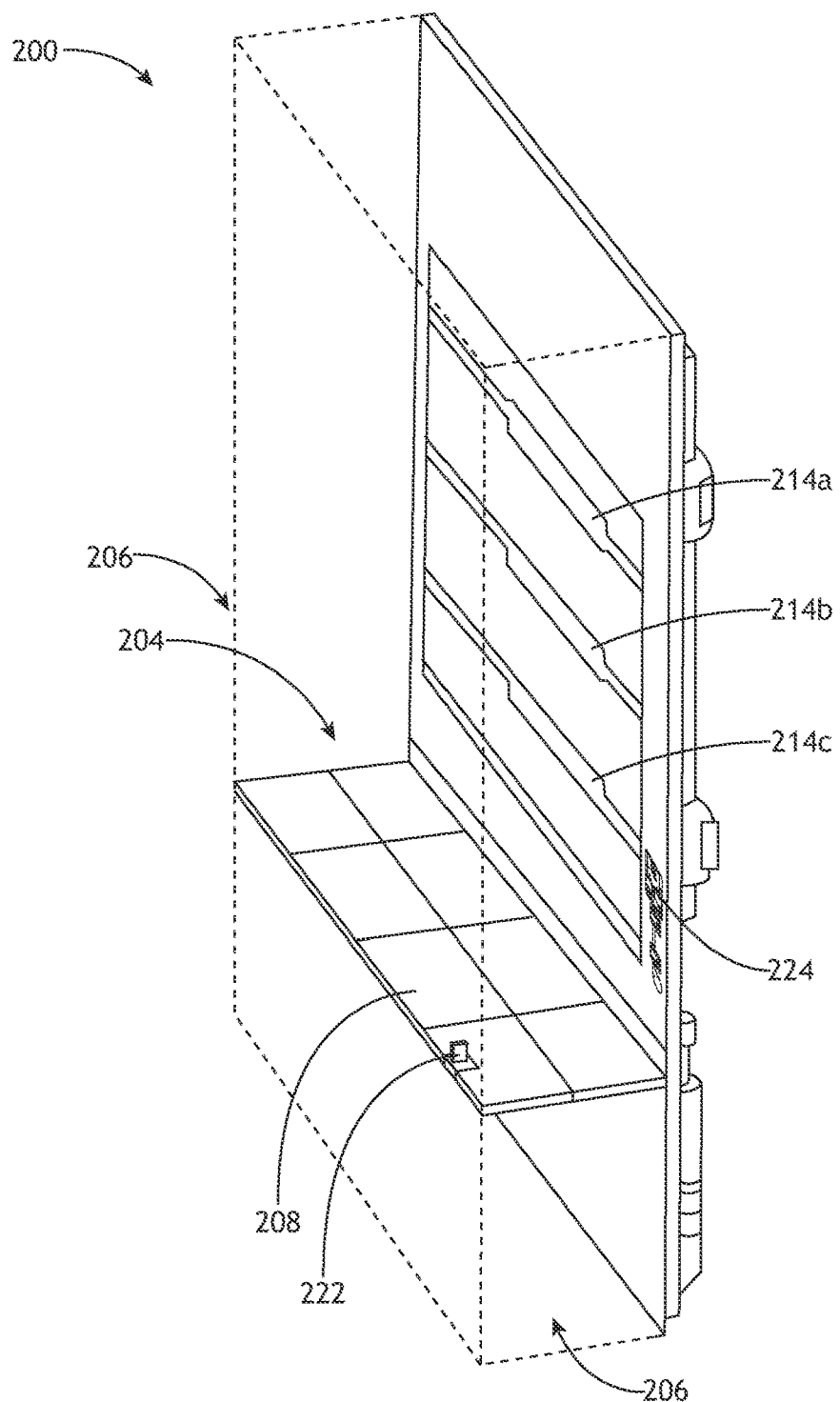
FIG. 2B illustrates a side perspective view of the mini-environment sub-system, in accordance with one or more embodiments of the present disclosure.
Figure 2C:
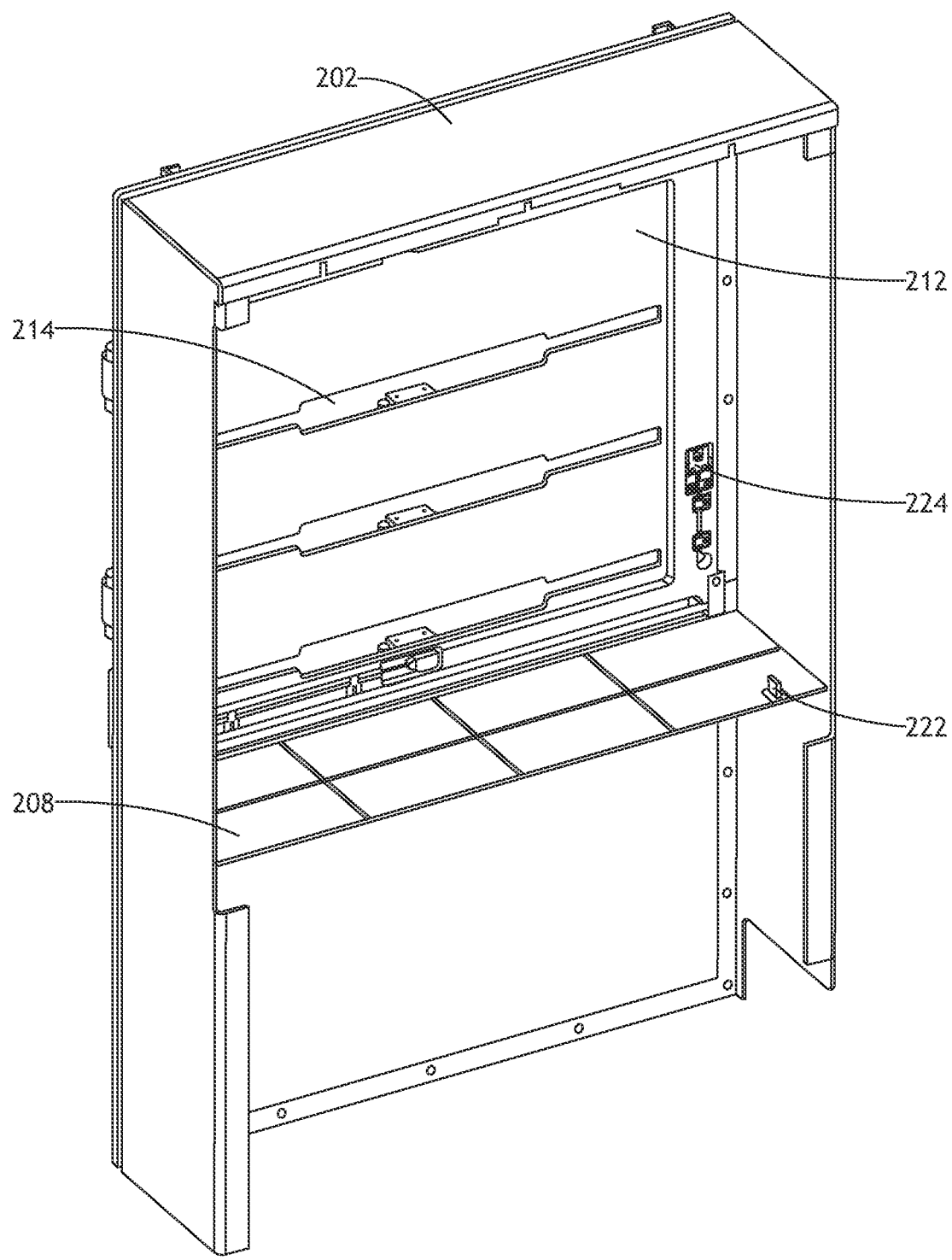
FIG. 2C illustrates a rear perspective view of the mini-environment sub-system, in accordance with one or more embodiments of the present disclosure.
Figure 2D:
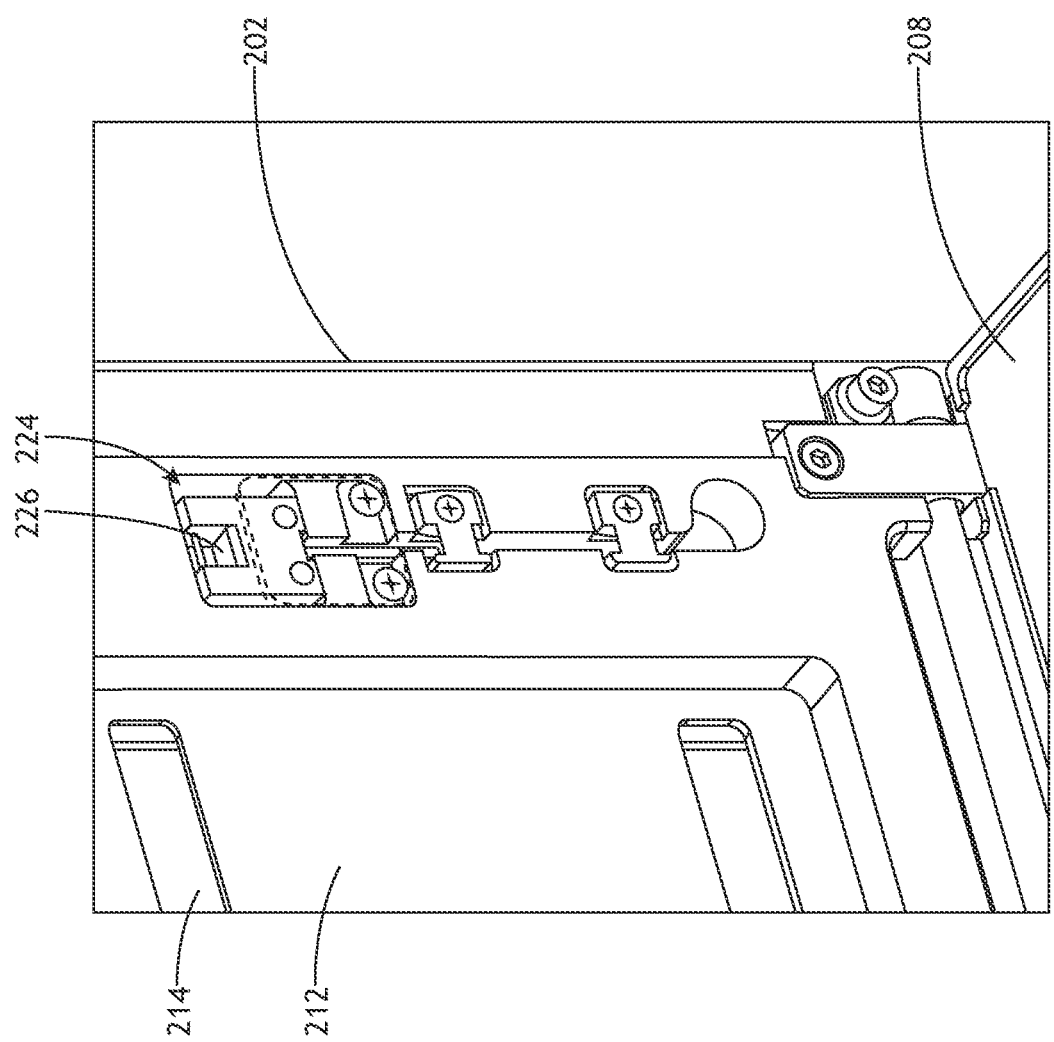
FIG. 2D illustrates an exploded view of the mini-environment sub-system, in accordance with one or more embodiments of the present disclosure.

FIGS. 2A-2B illustrate the mini-environment sub-system 102, in accordance with one or more embodiments of the present disclosure. In particular, FIG. 2A illustrates a conceptual view of the mini-environment sub-system 102, in accordance with one or more embodiments of the present disclosure. In particular, FIG. 2B illustrates a cross-sectional view of the mini-environment sub-system 102, in accordance with one or more embodiments of the present disclosure.

In embodiments, the mini-environment sub-system 102 includes an enclosure 200. The enclosure 200 may include a frame 202 that defines an internal cavity 204 of the enclosure 200. The frame 202 may include at least two openings 206. The enclosure 200 may be formed of any material including, but not limited to, aluminum, steel, plastic, or the like.

Figure 3:
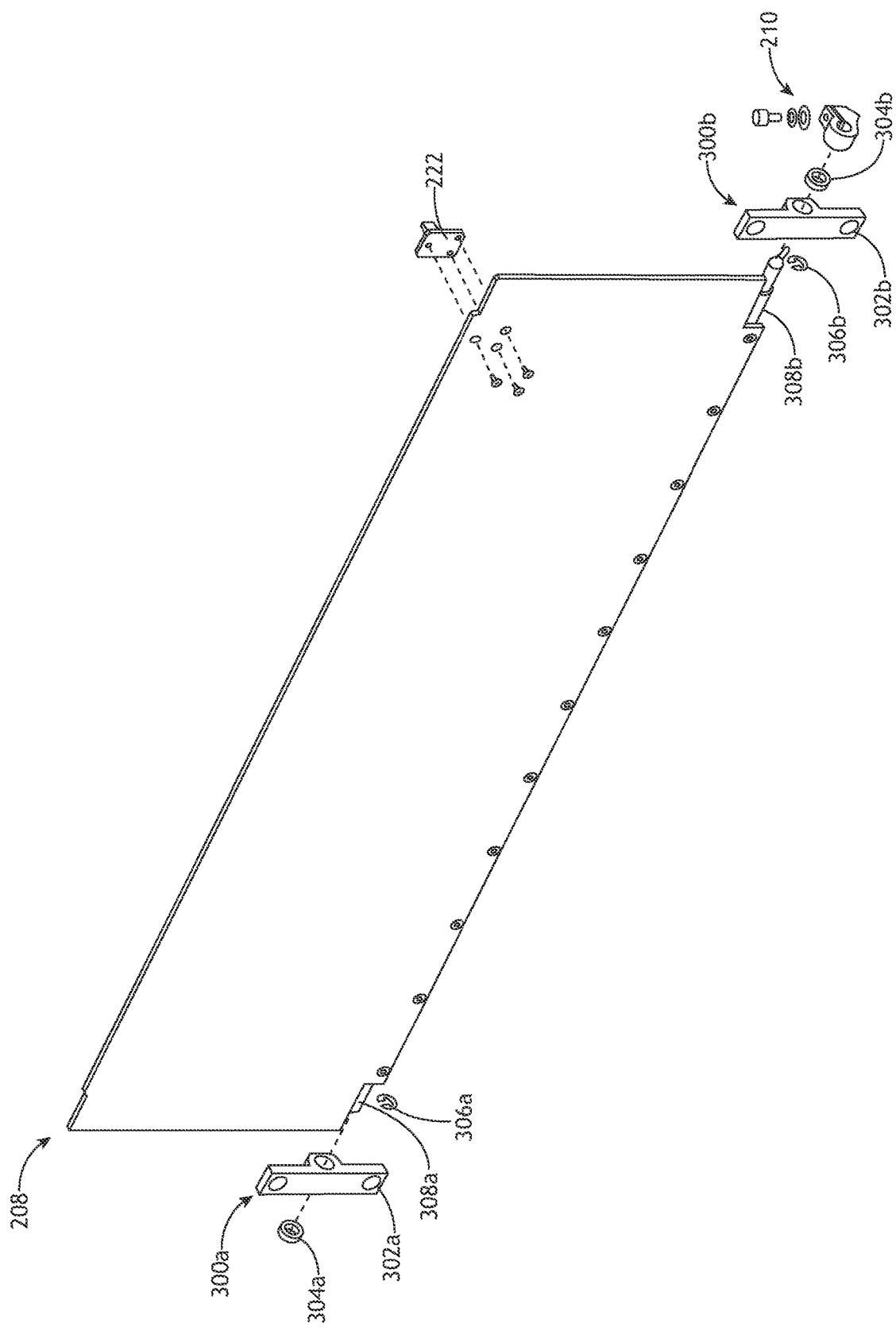
FIG. 3 illustrates an exploded view of a flapper blade assembly, in accordance with one or more embodiments of the present disclosure.

FIG. 3 illustrates an exploded view of the flapper blade 208, in accordance with one or more embodiments of the present disclosure.

In embodiments, the mini-environment sub-system 102 includes a flapper blade 208 and a flapper actuation assembly 210. The flapper blade 208 may be coupled to one or more components of the mini-environment sub-system 102 via any mechanism. For example, the flapper blade 208 may be coupled to a portion of the frame 202 of the enclosure 200 via one or more bearing assemblies 300. Each bearing assembly 300 may include, but is not limited to, a bearing housing 302, a bearing 304, and a retaining ring 306.

In embodiments, the flapper blade 208 includes a shaft 308 coupled to a portion of the flapper blade 208. The shaft 308 may be coupled to the flapper blade 208 via any mechanism. For example, the flapper blade 208 may include a cavity configured to receive a portion of the shaft 308. In one instance, the shaft 308 may be coupled to the cavity via one or more fasteners (e.g., screws, bolts, or the like). In another instance, the shaft 308 may include a keyed shaft and the flapper blade 208 may include a cavity complementary to the keyway width/depth to receive the keyed shaft. By way of another example, the flapper blade 208 may include one or more shaft caps coupled to one or more lower end portions of the flapper blade 208. For instance, the flapper blade 208 may include a first shaft cap and a second shaft cap.

The shaft 308 may be configured to couple the flapper blade 208 to the enclosure 200 via the one or more bearing assemblies 300. For example, a first end 308a of the shaft 308 may be coupled to a portion of the enclosure 200 via a first bearing housing 302a, a first bearing 304a, and a first retaining ring 306a.

The shaft 308 may be configured to couple the flapper blade 208 to the flapper actuation assembly 210 via the one or more bearing assemblies 300. For example, a second end 308b of the shaft 308 may be coupled to a portion of the flapper actuation assembly 210 via a second bearing housing 302b, a second bearing 304b, and a second retaining ring 306b. The second bearing housing 302b may be coupled to a portion of the flapper actuation assembly 210.

In embodiments, the flapper blade 208 may include one or more sensor flags 222 detectable by one or more sensors 224. For example, the flapper blade 208 may include one or more sensor flags 222 detectable by one or more optical sensors 224 including one or more slots 226 to detect when the flapper blade 208 is in one of the closed position (e.g., horizontal position) or the open position (e.g., vertical position). For instance, the one or more sensors may be configured to detect when the one or more sensor flags 222 of the flapper blade 208 are within the slot 226 of the one or more optical sensors 224. In this regard, when the one or more sensor flags 222 of the flapper blade 208 are detected within the slot 226 of the one or more optical sensors 224, the mini-environment sub-system 102 may be configured to verify that the flapper blade 208 in a fully closed position, such that a load port door does not translate open and crash into the flapper blade 208. When the one or more sensor flags 222 of the flapper blade 208 are not detected within the slot 226 of the one or more optical sensors 224, the mini-environment sub-system 102 may be configured to verify that the flapper blade 208 in a fully open position, such that the load port door may be translated open without crashing into the flapper blade 208.

Figure 4B:
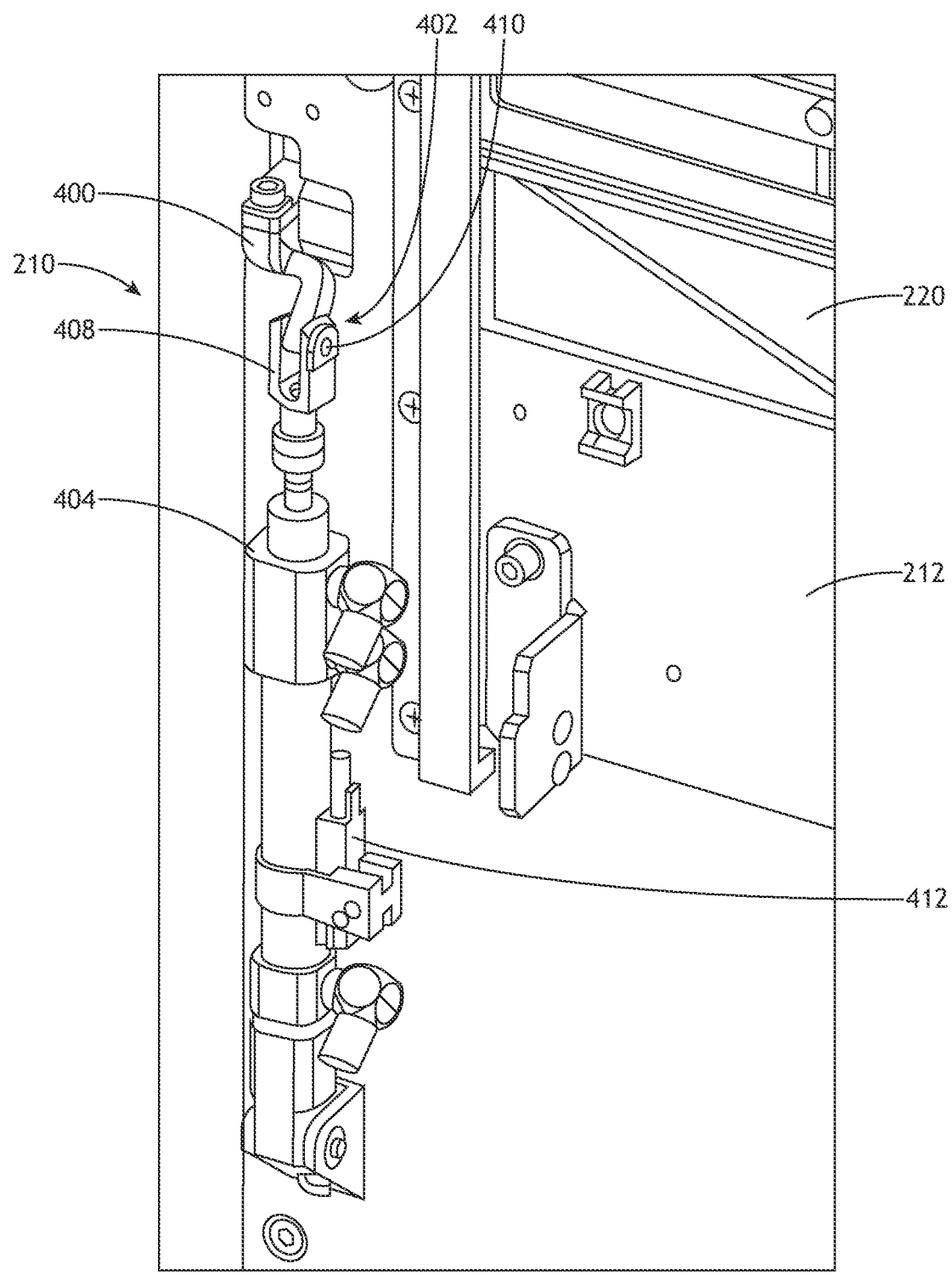
FIG. 4B illustrates an exploded view of the flapper actuator assembly, in accordance with one or more embodiments of the present disclosure.

FIGS. 4A-4B illustrate exploded views of the flapper actuation assembly 210, in accordance with one or more embodiments of the present disclosure.

The actuation assembly 210 may be configured to actuate the flapper blade 208 between a first position and at least a second position. For example, the actuation assembly 210 may be configured to actuate the flapper blade 208 between one of an open position and a closed position when a FOUP is open. In this regard, the enclosure 200 may be configured to provide a sealed environment when the flapper blade 208 is in the closed position (e.g., horizontal position) to prevent the remaining samples within the FOUP from being exposed to ambient air when the FOUP is open. By way of another example, the actuation assembly 210 may be configured to actuate the flapper blade 208 between one of a closed position and an open position when a FOUP is closed.

In embodiments, the actuation assembly 210 includes a flapper arm 400, a rod clevis assembly 402, and a flapper actuator 404.

In embodiments, the second shaft end 308b may be coupled to the flapper arm 400 of the actuation assembly 210. For example, the flapper arm 400 may include an opening configured to receive the second end 308b of the shaft 308 and couple to the retaining ring 306b. In this regard, the retaining ring 306b may be configured to secure the shaft 308 in the x-axis (e.g., prevent the shaft 308 from moving in the x-axis). By way of another example, the flapper arm 400 may include a fastener opening configured to receive a fastener 406. In this regard, when the fastener 406 is tightened within the opening, the flapper arm 400 may secure the second end 308b of the shaft 308 in the y- and z-axis (e.g., prevent the shaft 308 from moving in the y- and/or z-axis).

In embodiments, the flapper arm 400 is configured to couple to the rod clevis assembly 402. For example, the flapper arm 400 may be configured to couple to a clevis 408 via a clevis pin 410 and a retaining ring. In this regard, when the rod clevis assembly 402 is translated in the y-direction, via the flapper actuator 404, the flapper arm 400 may pivot via the clevis pin 410 to cause the flapper blade 208 to swivel.

In embodiments, the rod clevis 408 is coupled to the flapper actuator 404 to actuate the flapper blade 208. For example, the flapper actuator 404 may be configured to pull down on the flapper arm 400 to actuate the flapper blade 208 between the closed position (e.g., horizontal position) and the open position (e.g., vertical position). By way of another example, the flapper actuator 404 may be configured to push up on the flapper arm 400 to actuate the flapper blade 208 between the open position (e.g., vertical position) and the closed position (e.g., horizontal position).

In embodiments, the flapper actuator 404 may include one or more sensors 412 to detect a position of the flapper blade 208. For example, the flapper actuator 404 may include one or more cylinder state sensors 412 to detect when the flapper blade 208 is in one of an open position or closed position. In one instance, the one or more cylinder state sensors 412 may be configured to detect when the actuator 404 is in an active state (e.g., open state), such that the flapper blade 208 is in an open position. In another instance, the one or more cylinder state sensors 412 may be configured to detect when the actuator 404 is in an inactive state (e.g., closed state), such that the flapper blade 208 is in a closed position. In this regard, the mini-environment sub-system 102 may be configured to verify the position of the flapper blade 208, such that the flapper blade 208 does not disturb one or more moving parts (e.g., load port door, sample mapper, or the like).

It is noted that the flapper actuator 404 may include any type of actuator known in the art including, but not limited to, a pneumatic actuator (e.g., pneumatic cylinder actuator), hydraulic actuator, mechanical actuator, or the like. Further, it is noted that the flapper actuator 404 may be cleanroom compatible to prevent airborne contamination.

In embodiments, the controller 104 is configured to generate one or more actuator control signals and provide the one or more actuator control signals to the flapper actuator 404. For example, the controller 104 may provide the one or more actuator control signals to the flapper actuator 404 to cause the flapper actuator 404 push up/down on the clevis assembly 402 to rotate the flapper arm 400, such that the flapper blade 208 may be actuated/swiveled between the closed and open position, and vice versa.

Referring to FIG. 2A-2B, in embodiments, the mini-environment sub-system 102 may include a floating plate 212. For example, the mini-environment sub-system 102 may include a floating plate 212 coupled to a portion of the frame 202, where the floating plate 212 at least partially forms the frame 202 of the enclosure 200. For instance, the frame 202 may include an opening and the floating plate 212 may be configured to couple to that portion of the frame 202, such that the floating plate 212 forms a sealed environment.

In embodiments, the floating plate 212 includes one or more slots 214. For example, the floating plate 212 may include a first slot 214a, a second slot 214b, a third slot 214c, up to an N number of slots. For instance, the one or more slots 214 may correspond to one or more sections with a FOUP. In this regard, the first slot 214a may correspond to an upper section of the FOUP, the second slot 214b may correspond to a middle section of the FOUP, and the third slot 214c may correspond to a lower section of the FOUP. As discussed further herein, each section of the FOUP (e.g., upper, middle, lower, or the like) may include a plurality of storage features (e.g., slots) within the FOUP to secure one or more samples within the FOUP. In this regard, each section may correspond to a predetermined amount of samples within the FOUP. For example, for 25 samples, the upper section may correspond to samples 1-8, the middle section may correspond to samples 9-16, and the lower section may correspond to samples 17-25.

In embodiments, the mini-environment sub-system 102 may include a floating plate actuator 216 configured adjust the position of the floating plate 212 in the y-direction (up/down) to align the one or more slots 214 of the floating plate 212 with a desired slot in the FOUP. For example, the floating plate actuator 216 may be configured to adjust the position of the floating plate 212 in the y-direction to position the first slot 214a within the upper section of the FOUP. For instance, the floating plate actuator 216 may be configured to adjust the position of the floating plate 212 in the y-direction to align the first slot 214a with a desired slot within the upper section of the FOUP. By way of another example, the floating plate actuator 216 may be configured to adjust the position of the floating plate 212 in the y-direction to position the second slot 214b within the middle section of the FOUP. For instance, the floating plate actuator 216 may be configured to adjust the position of the floating plate 212 in the y-direction to align the second slot 214b with a desired slot within the middle section of the FOUP. By way of another example, the floating plate actuator 216 may be configured to adjust the position of the floating plate 212 in the y-direction to position the third slot 214c within the lower section of the FOUP. For instance, the floating plate actuator 216 may be configured to adjust the position of the floating plate 212 in the y-direction to align the third slot 214c with a desired slot within the lower section of the FOUP. In this regard, the floating plate actuator 216 may be configured to adjust the position of the floating plate 212 a select distance in the y-direction based on where the sample is located (e.g., upper section, middle section, or lower section), such that the sample may be extracted/retracted from the desired slot through the corresponding slot in the floating plate 212. Although FIG. 2B illustrates three slots (e.g., a first slot 214a, a second slot 214b, and a third slot 214c), it is noted that the floating plate 212 may include any number of slots to correspond to any number of slots and/or samples within the FOUP. Further, it is noted that the floating plate actuator 216 may be configured to adjust the position of the floating plate any select distance. For example, the floating plate actuator 216 may be configured to adjust the position of the floating plate+/−40 mm.

In embodiments, the controller 104 is configured to generate one or more actuator control signals and provide the one or more actuator control signals to the floating plate actuator 216. For example, the controller 104 may provide the one or more actuator control signals to the floating plate actuator 216 to cause the floating plate actuator 216 to translate the floating plate 212 a select distance. For instance, the floating plate actuator 216 may be configured to translate the floating plate 212 a select distance in the y-direction to align the floating plate with a desired slot based on received control signals from the controller 104. In this regard, the one or more control signals may indicate where the sample is located within the FOUP (e.g., upper section, middle section, or lower section) based on the data from an encoder (e.g., sample mapper) and align the floating plate 212 to that desired sample, such that the sample may be extracted/retracted from the desired slot through the corresponding slot 214a-214c in the floating plate 212.

It is noted that the floating plate actuator 216 may include any type of actuator including, but not limited to, an electric motor, or the like. Further, it is noted that the floating plate actuator 216 may be cleanroom compatible to prevent airborne contamination.

Figure 5:
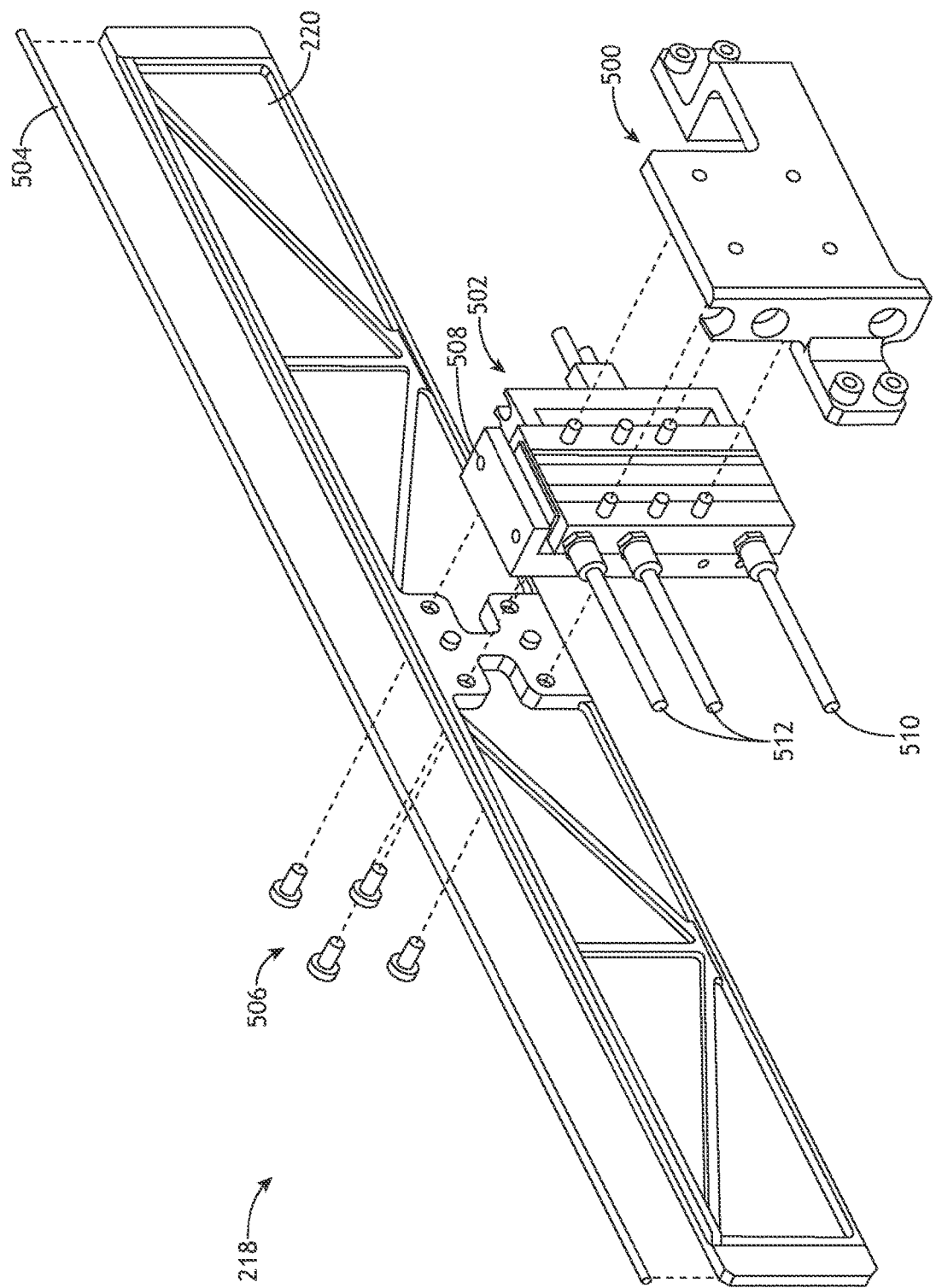
FIG. 5 illustrates an exploded view of a shutter assembly, in accordance with one or more embodiments of the present disclosure.

In embodiments, the mini-environment sub-system 102 may include one or more shutter assemblies 218. Referring to FIG. 5, each shutter assembly 218 may include, but is not limited to, a shutter plate 220, a shutter holder 500, a shutter actuator 502, one or more sealing devices 504, and the like.

In embodiments, the one or more shutter assemblies 218 may be configured to couple to a portion of the floating plate 212. For example, the one or more shutter assemblies 218 may be configured to couple to a portion of the floating plate 212 via one or more shutter holders 500. The one or more shutter holders 500 may be configured to secure the shutter actuator 502 and the shutter plate 220 to a portion of the floating plate 212, via one or more fasteners 506, such that the shutter plate 220 is arranged on each slot 214a-214c of the floating plate 212. For example, the one or more shutter plates 220 may be dimensioned to cover the area of each slot 214, such that the one or more shutter plates 220 cover the slot opening.

In embodiments, the shutter actuator 502 may be configured to open/close the shutter plate 220 to allow one or more samples to be loaded/unloaded into/from the FOUP. The shutter actuator 502 may include any type of actuator. For example, the shutter actuator 502 may include a pneumatic linear slide actuator 502. The shutter actuator 502 may couple to the shutter plate 220 via one or more guides 508. For example, the actuator 502 may include one or more clean dry air (CDA) hoses 510 configured to provide a select amount of pressure to cause the guide 508 to slide the shutter plate 220 between the open and closed position.

It is noted that the shutter actuator 502 may be clean room compatible. For example, the shutter actuator 502 may include one or more suction hoses 512 configured to remove dirty air to prevent airborne contamination.

In embodiments, the controller 104 is configured to generate one or more actuator control signals and provide the one or more actuator control signals to the shutter actuator 502. For example, the controller 104 may provide the one or more actuator control signals to the shutter actuator 502 to cause the shutter actuator to open/close the shutter plate 220.

In embodiments, the shutter plate 224 may include a sealing cord 504 on a top surface of the shutter plate 220 to prevent/minimize the escape of nitrogen gas from the internal cavity 204 of the enclosure 200. The sealing cord 504 may include any type of sealing cord including, but not limited to, a silicon sealing O-ring cord, or the like.

Figure 6B:
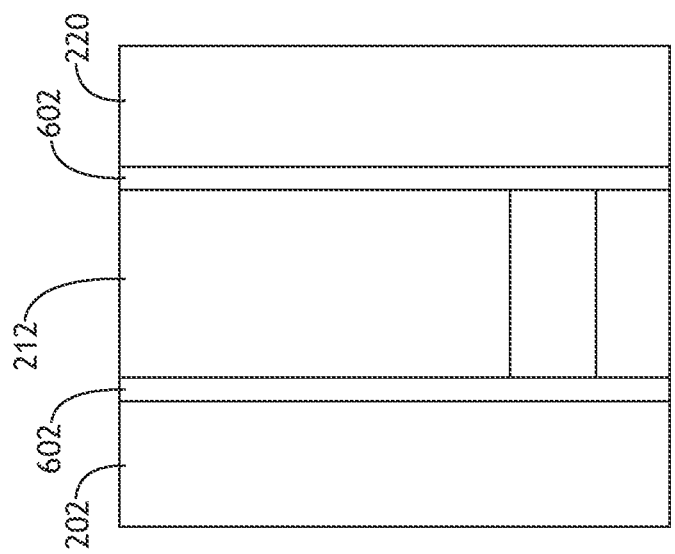
FIG. 6B illustrates an exploded vertical cross-sectional view of the mini-environment sub-system, in accordance with one or more embodiments of the present disclosure.

FIGS. 6A-6C illustrate one or more labyrinths 600 of the mini-environment sub-system 102, in accordance with one or more embodiments of the present disclosure. In particular, FIG. 6A illustrates an exploded vertical cross-sectional view of the apparatus, in accordance with one or more embodiments of the present disclosure. In particular, FIG. 6B illustrates an exploded vertical cross-sectional view of the apparatus, in accordance with one or more embodiments of the present disclosure. In particular, FIG. 6C illustrates an exploded horizontal cross-sectional view of the apparatus, in accordance with one or more embodiments of the present disclosure.

In embodiments, the mini-environment sub-system 102 includes one or more labyrinths 600 to help prevent leakage. For example, the one or more labyrinths 600 may be installed on each side of the floating plate 212. In one instance, the labyrinth 600 may be installed between the frame 202 and the floating plate 212 to create one or more small gaps 602 between the frame 202 and the floating plate 212. In another instance, the labyrinth 600 may be installed between the shutter plate 220 and the floating plate 212 to create one or more small gaps 602 between the shutter plate 220 and the floating plate 212. It is noted that the one or more labyrinths 600 may help to prevent the escape of nitrogen gas. Further it is noted that the one or more small gaps 602 may allow for proper flow dynamics and support cleanliness, such that one or more components of the mini-environment sub-system 102 may move without contacting other components of the mini-environment sub-system 102.

The one or more small gaps 602 may be any size. For example, the one or more small gaps may be between 0-1 mm. In one instance, the one or more small gaps may be 0.5 mm. In another instance, the one or more small gaps may be 0.2 mm.

Figure 7A:
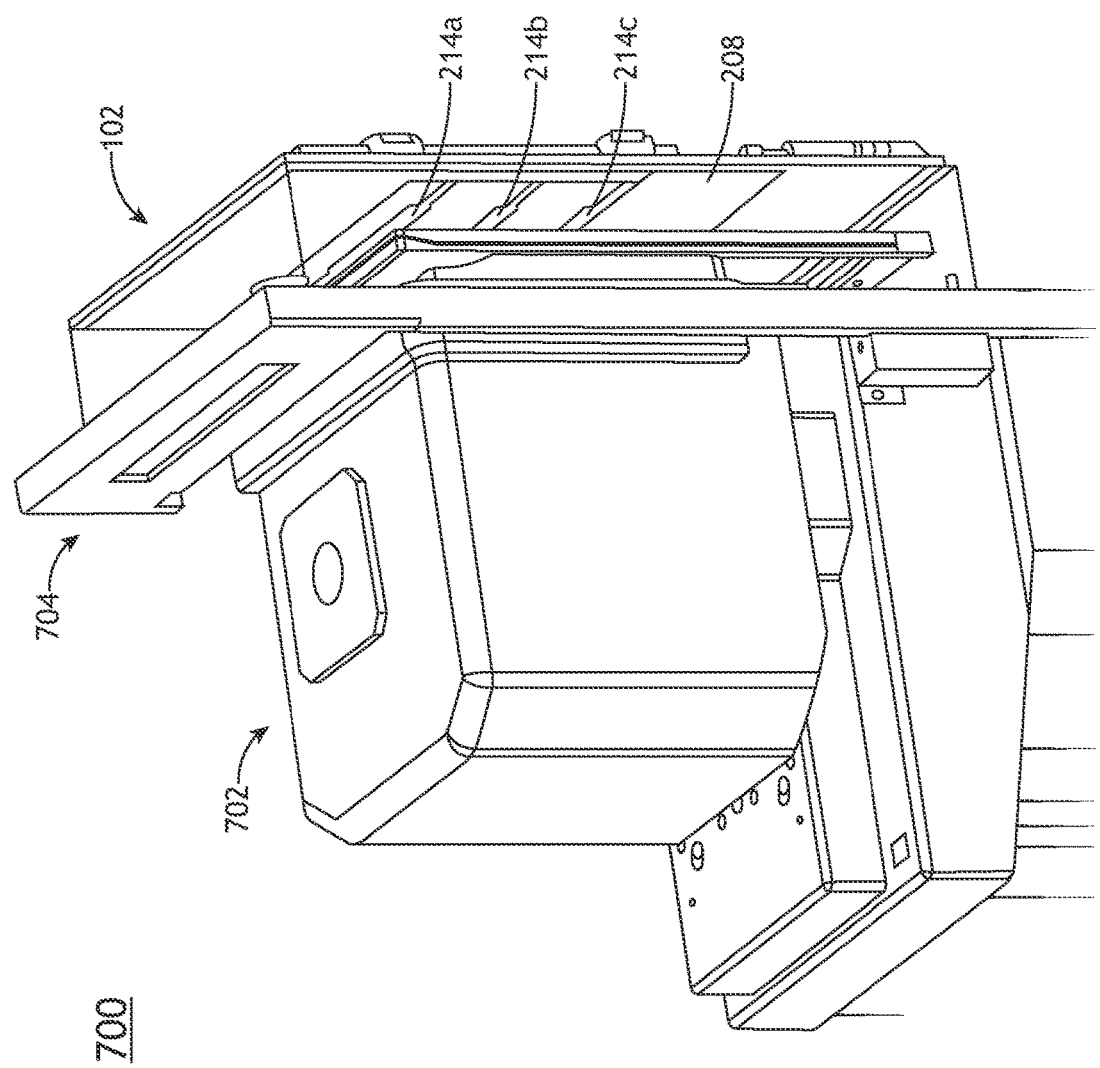
FIG. 7A illustrates a conceptual view of a system integrating the mini-environment sub-system, in accordance with one or more embodiments of the present disclosure.
Figure 7C:
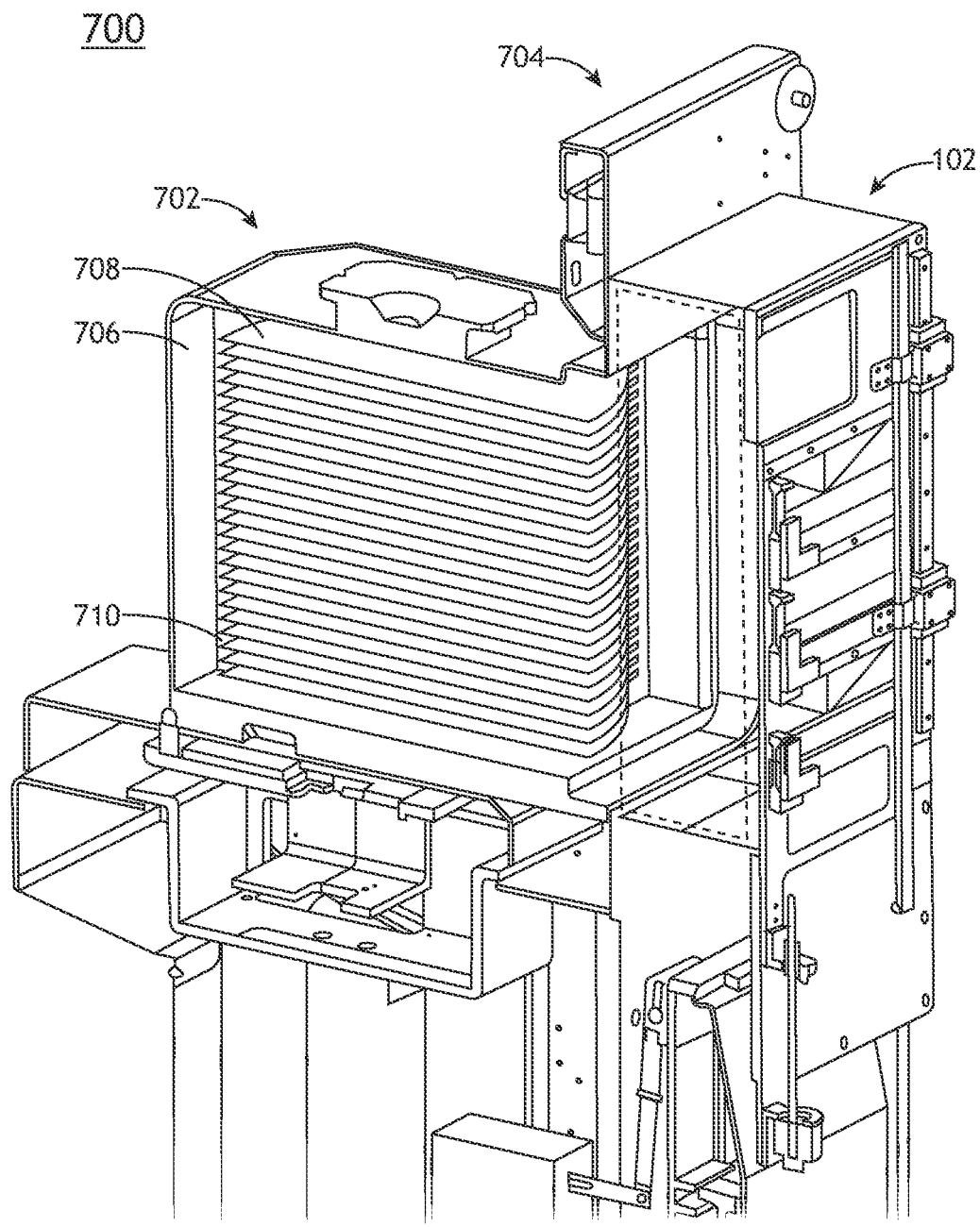
FIG. 7C illustrates a cross-sectional view of a system integrating the mini-environment sub-system, in accordance with one or more embodiments of the present disclosure.

FIGS. 7A-7C illustrate a sample device system 700 integrated with the mini-environment sub-system 102, in accordance with one or more embodiments of the present disclosure. It is noted that the description of the various embodiments, components, and operations described previously herein with respect to the mini-environment controller system 100 should be interpreted to extend to the system 700, and vice versa. Further, it is noted that the description of the various embodiments, components, and operations described previously herein with respect to the mini-environment sub-system 102 should be interpreted to extend to the system 700, and vice versa.

In embodiments, the system 700 includes a sample transport device 702 (e.g., a FOUP), a load port 704, and the mini-environment sub-system 102.

In embodiments, the mini-environment sub-system 102 is configured to provide a sealed mini-environment between the enclosure 200 and the load port 704. For example, a portion of the frame 202 may be removably couplable to a portion of the load port 704. In this regard, the mini-environment sub-system 102 may be positioned adjacent to an opening of the load port 704 and removably coupled to a portion of the load port 704 via one or more fastener assemblies (e.g., brackets, screws, bearings, or the like).

In embodiments, the mini-environment sub-system 102 may be positioned adjacent to an automated handling system. For example, the mini-environment sub-system 102 may be positioned between the load port 704 and the automated handling system. In this regard, the mini-environment sub-system 102 is configured to interface with the FOUP 702 to allow the automated handling system to extract/retract one or more samples from the FOUP 702.

In embodiments, the FOUP 702 includes a chamber 706 for the one or more samples 708. The FOUP 702 may thus provide a protective environment for the transport of the samples 708 during one or more process steps. The FOUP 702 may further provide a clean environment in which the atmosphere and particulates are controlled.

In embodiments, the FOUP 702 includes one or more storage features 710 suitable for securing items such as, but not limited to, samples 708. The FOUP 702 may incorporate any type of storage features known in the art such as, but not limited to, slots, racks, or fins. Each section of the FOUP (e.g., upper, middle, lower, or the like) may include a plurality of storage features (e.g., slots) within the FOUP 702 to secure one or more samples 708 within the FOUP 702. In this regard, each section may correspond to a predetermined amount of samples within the FOUP. For example, for 25 samples, the upper section may correspond to samples 1-8, the middle section may correspond to samples 9-16, and the lower section may correspond to samples 17-25.

In embodiments, the FOUP 702 includes one or more components for coupling to additional components such as, but not limited to, an automated handling system, a loadport of a tool, or a loadport of a buffer station.

In embodiments, the FOUP 702 includes a FOUP lid 714 configured to create a closed, sealed chamber 706 for the samples 708.

In embodiments, the load port 704 may be configured to open the lid 714 of the FOUP 702. For example, the load port 704 may include a load port door 716 configured to open the lid 714 of the FOUP 702 when the door 716 is in close contact with the lid 714. For instance, the load port door 716 may be configured to open the lid 714 by grabbing the lid 714 and translating the lid 714 below the flapper blade 208. When the load port door 716 is in the open position, as shown in FIG. 7A, the flapper blade 208 may be in the open position (e.g., vertical position). In this regard, the load port door 716 may be configured to open the FOUP lid 714 and translate the door 716 below the flapper blade 208. When the load port door 716 is in the closed position, as shown in FIG. 7B, the flapper blade 208 may be in the closed position (e.g., horizontal position). In this regard, the flapper blade 208 may form a sealed enclosure when in the closed position (e.g., horizontal position) to prevent the samples 708 within the chamber 706 from being exposed to ambient air (e.g., to prevent ambient air from entering the chamber).

In embodiments, the load port 704 may include a purge device configured to blow a predetermined amount of gas (e.g., nitrogen gas) into the FOUP chamber 706 using a purge nozzle. For example, the purge device may be configured to continuously blow a predetermined amount of gas into the FOUP when the load port door is open to prevent the samples from being exposed to ambient air when the load port door is open.

Sample transport devices are generally discussed in U.S. Patent Publication No. 2019/0295874, entitled Sample Transport Device With Integrated Metrology, published on Sep. 26, 2019, which is herein incorporated by reference in the entirety.

The controller 104 may include one or more processors 106 configured to execute program instructions maintained on a memory medium 108. In this regard, the one or more processors 106 of controller 104 may execute any of the various process steps described throughout the present disclosure.

The one or more processors 106 of a controller 104 may include any processing element known in the art. In this sense, the one or more processors 106 may include any microprocessor-type device configured to execute algorithms and/or instructions. In embodiments, the one or more processors 106 may consist of a desktop computer, mainframe computer system, workstation, image computer, parallel processor, or any other computer system (e.g., networked computer) configured to execute a program configured to operate the mini-environment control system 100, as described throughout the present disclosure. It is further recognized that the term "processor" may be broadly defined to encompass any device having one or more processing elements, which execute program instructions from a non-transitory memory medium 108.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory, a random-access memory, a magnetic or optical memory device (e.g., disk), a magnetic tape, a solid-state drive and the like. It is further noted that memory medium 108 may be housed in a common controller housing with the one or more processors 106. In embodiments, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like). Therefore, the above description should not be interpreted as a limitation on the present invention but merely an illustration.

Figure 8:
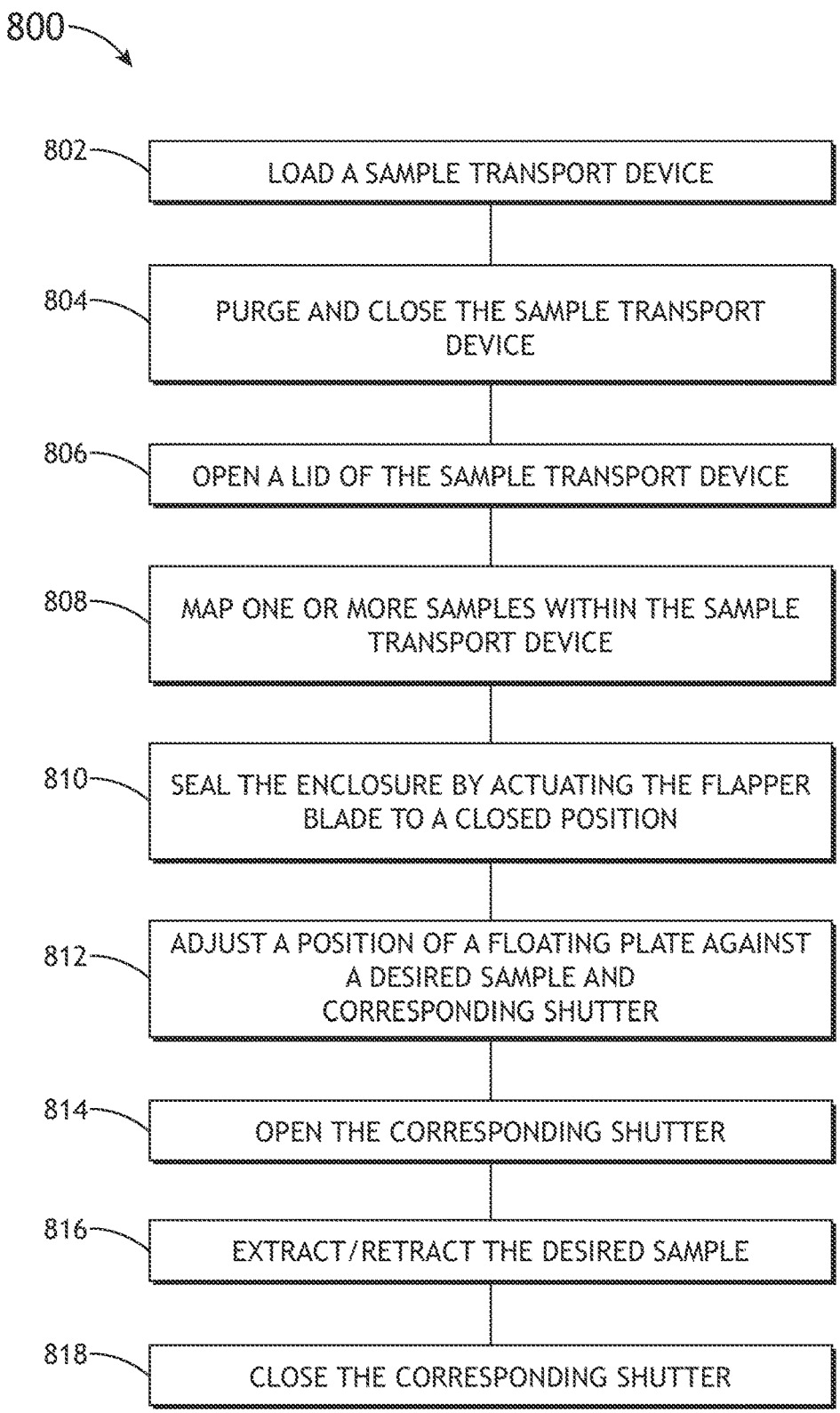
FIG. 8 illustrates a flowchart depicting a method or process for the mini-environment sub-system, in accordance with one or more embodiments of the present disclosure.

FIG. 8 illustrates a flowchart depicting a method or process 800 for the system 700, in accordance with one or more embodiments of the present disclosure.

In a step 802, the FOUP may be loaded with one or more samples. For example, the chamber 706 of the FOUP 702 may be loaded with one or more samples 708. For instance, the one or more sections (e.g., upper, middle, lower) may be loaded with a predetermined number of samples. It is noted that the FOUP may be docked on a load port before or after step 802. For example, the FOUP may be docked on a stage of the load port and secured to the load port.

In a step 804, the FOUP may be purged and sealed. For example, the FOUP lid 714 may be closed using the load port door 716 to create a sealed chamber and purged with nitrogen gas to clean the FOUP environment using the purge nozzle of the load port 704.

In a step 806, the FOUP lid may be opened. For example, the load port 704 may include a load port door 716 configured to open the lid 714 of the FOUP 702 when the door 716 is in close contact with the lid 714. For instance, the load port door 716 may be configured to open the lid 714 by grabbing the lid 714 and translating the lid 714 below the flapper blade 208. When the load port door 716 is in the open position, as shown in FIG. 7A, the flapper blade 208 may be in the open position (e.g., vertical position). In this regard, the load port door 716 may be configured to open the FOUP lid 714 and translate the door 716 below the flapper blade 208. When the load port door 716 is in the closed position, as shown in FIG. 7B, the flapper blade 208 may be in the closed position (e.g., horizontal position). In this regard, the flapper blade 208 may form a sealed enclosure when in the closed position (e.g., horizontal position) to prevent the samples 708 within the chamber 706 from being exposed to ambient air (e.g., to prevent ambient air from entering the chamber).

In an optional step 808, a sample mapper may map the one or more samples within the FOUP and generate sample position data. For example, the sample mapper may provide to generated sample position data to a controller 104.

In a step 810, the flapper blade may be actuated from the open position (e.g., vertical position) to the closed position (e.g., horizontal position). For example, the controller 104 may provide to the flapper actuator 404 one or more control signals to cause the flapper actuator 404 to actuate the flapper blade 208 between the open position (e.g., vertical position) to the closed position (e.g., horizontal position). For instance, the controller 104 may receive one or more sample mapper signals from the sample mapper and generate one or more flapper actuator control signals when the sample mapper is in the lowest position and the FOUP door has been opened to cause the flapper actuator 404 to actuator to actuate the flapper blade 208 between the open (e.g., vertical position) to the closed position (e.g., horizontal position). In this regard, the flapper blade 208 may form cover the at least one opening 206 of the enclosure to create a sealed enclosure 200.

In a step 812, the position of the floating plate 212 may be adjusted against the desired sample/corresponding shutter. For example, the controller 104 may be configured to generate one or more actuator control signals and provide the one or more actuator control signals to the floating plate 212 to cause the floating plate actuator to adjust the position of the floating plate 212. For instance, the floating plate actuator 216 may be configured to translate the floating plate 212 a select distance in the y-direction to align the floating plate with a desired slot based on received control signals from the controller 104. In this regard, the one or more control signals may indicate where the sample is located within the FOUP (e.g., upper section, middle section, or lower section) based on the data from an encoder (e.g., sample mapper) and align the floating plate 212 to that desired sample, such that the sample may be extracted/retracted from the desired slot through the corresponding slot 214*a*-214*c* in the floating plate 212.

In a step 814, the corresponding shutter may be opened. For example, the controller 104 may be configured to generate one or more actuator control signals and provide the one or more actuator control signals to the shutter actuator to cause the shutter actuator to open the corresponding shutter plate 220.

In a step 816, the sample may be extracted/retracted from/into the FOUP. For example, an automated handling system may be configured to extract/retract the samples from/into the chamber of the FOUP. In this regard, a portion of the automated handling system may be inserted into the sealed mini-environment sub-system to safely extract/retract the samples without exposing the remaining samples within the FOUP to ambient air when the door is open.

In a step 818, the corresponding shutter may be closed. For example, the controller 104 may be configured to generate one or more actuator control signals and provide the one or more actuator control signals to the shutter actuator to cause the shutter actuator to open the shutter plate 220. In this regard, the shutter actuator may be configured to close the shutter plate 220 once the sample(s) has/have been extracted/retracted.

It is contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An apparatus comprising:
    an enclosure, the enclosure including a frame, the frame defining an internal cavity within the enclosure, wherein the enclosure includes a plate forms a portion of the frame, the plate including two or more slots;
    a flapper blade, the flapper blade coupled to a portion of the frame, the flapper blade configured to close at least one opening of the frame to form a sealed enclosure when the flapper blade is in a closed position;
    two or more shutters, the two or more shutters coupled to a portion of the plate to cover the two or more slots, wherein a respective shutter is configured to cover a respective opening when in a closed state, wherein the respective shutter is configured to open and close to allow for extraction of a wafer from a FOUP without contamination to additional wafers of the FOUP.

2. The apparatus of claim 1, further comprising:
    a flapper actuator assembly, the flapper actuator assembly configured to actuate the flapper blade between the closed position and an open position, the flapper actuator assembly configured to actuate the flapper blade between the open position and the closed position.

3. The apparatus of claim 2, wherein the flapper actuator assembly includes:
    a flapper arm coupled to a shaft of the flapper blade;
    a flapper actuator device; and
    a clevis assembly configured to couple the flapper arm to the flapper actuator device.

4. The apparatus of claim 3, wherein the flapper actuator device is configured to translate a clevis of the clevis assembly a select distance in a y-direction to cause the flapper arm to rotate to cause the flapper actuator device to actuate the flapper blade between the closed position and the open position.

5. The apparatus of claim 3, wherein the flapper actuator assembly further includes:
    one or more sensors coupled to a portion of the flapper actuator device, the one or more sensors configured to detect when the flapper actuator device is in one of a closed state or an open state.

6. The apparatus of claim 1, further comprising:
    a floating plate actuator assembly, the floating plate actuator assembly configured to adjust a position of the floating plate to align the one or more slots of the floating plate with a sample slot of a sample transport device.

7. The apparatus of claim 1, wherein the shutter actuator assembly includes:
    a linear actuator configured to one of open or close a shutter of the one or more shutters via one or more guides.

8. The apparatus of claim 7, wherein the linear actuator includes one or more suction hoses to prevent airborne contamination.

9. The apparatus of claim 1, wherein the one or more shutters are coupled to the floating plate using one or more shutter holders.

10. The apparatus of claim 1, further comprising:
    one or more sensors coupled to a portion of the frame, the one or more sensors configured to detect when the flapper blade is in one of the closed position or the open position.

11. The apparatus of claim 10, wherein the flapper blade includes at least one sensor flag detectable by the one or more sensors to detect when the flapper blade is in one of the closed position or the open position.

12. The apparatus of claim 1, further comprising:
one or more labyrinths arranged adjacent to one or more portions of the floating plate to create one or more small gaps.

13. The apparatus of claim 12, wherein the one or more small gaps are 0.5 mm gaps.

14. The apparatus of claim 1, wherein the one or more shutters include at least one sealing device arranged on a top portion of the one or more shutters to minimize gas leakage through the one or more shutters.

15. The apparatus of claim 14, wherein the at least one sealing device comprises at least one O-ring cord.

16. A system comprising:
an environmental sub-system, the environmental sub-system comprising:
an enclosure, the enclosure including a frame, the frame defining an internal cavity within the enclosure, wherein the enclosure includes a plate forming a portion of the frame, the plate including two or more slots;
a flapper blade, the flapper blade coupled to a portion of the frame; the flapper blade configured to close at least one opening of the frame to form a sealed enclosure when the flapper blade is in a closed position;
a flapper actuator assembly, the flapper actuator assembly configured to actuate the flapper blade between the closed position and an open position, the flapper actuator assembly configured to actuate the flapper blade between the open position and the closed position;
a plate actuator assembly, the plate actuator assembly configured to adjust a position of the plate to align the one or more slots of the plate with a sample slot of a FOUP; and
two or more shutters, the two or more shutters coupled to a portion of the plate to cover the two or more slots, wherein a respective shutter is configured to cover a respective opening when in a closed state, wherein the respective shutter is configured to open and close to allow for extraction of a wafer from a FOUP without contamination to additional wafers of the FOUP;
a controller communicatively coupled to the environmental sub-system, the controller including one or more processors configured to cause the one or more processors to:
generate one or more flapper blade actuator control signals;
provide the one or more flapper blade actuator control signals to the flapper actuator assembly to cause the flapper actuator assembly to actuate the flapper blade between the closed position and the open position;
generate one or more floating plate actuator control signals;
provide the one or more floating plate actuator control signals to the floating plate actuator assembly to cause the floating plate actuator assembly to adjust a position of the floating plate;
generate one or more shutter actuator control signals; and
provide the one or more shutter actuator control signals to the shutter actuator assembly to cause the shutter actuator assembly to one of open or close the shutters.

17. The system of claim 16, wherein the controller is further configured to:
receive one or more sample mapper signals from a sample mapper, the one or more sample mapper signals including sample position data and sample mapper position data;
generate one or more flapper blade actuator control signals based one the received one or more sample mapper signals; and
provide the one or more flapper blade actuator control signals to the flapper actuator assembly to cause the flapper actuator assembly to actuate the flapper blade between the closed position and the open position when the sample mapper is in the lowest position.

18. The system of claim 16, wherein the flapper actuator assembly includes:
a flapper arm coupled to a shaft of the flapper blade;
a flapper actuator device; and
a clevis assembly configured to couple the flapper arm to the flapper actuator device.

19. The system of claim 18, wherein the flapper actuator device is configured to translate a clevis of the clevis assembly in a y-direction to cause the flapper arm to rotate to cause the flapper actuator device to actuate the flapper blade between the closed position and the open position.

20. The system of claim 18, wherein the flapper actuator assembly further includes:
one or more sensors coupled to a portion of the flapper actuator device, the one or more sensors configured to detect when the flapper actuator device is in one of a closed state or an open state.

21. The system of claim 16, further comprising:
one or more sensors coupled to a portion of the frame, the one or more sensors configured to detect when the flapper blade is in one of the closed position or the open position.

22. The system of claim 21, wherein the flapper blade includes at least one sensor flag detectable by the one or more sensors to detect when the flapper blade is in one of the closed position or the open position.

23. The system of claim 16, wherein the environment sub-system further comprises:
one or more labyrinths arranged adjacent to one or more portions of the floating plate to create one or more small gaps.

24. The system of claim 23, wherein the one or more small gaps are 0.5 mm gaps.

25. The system of claim 16, wherein the two or more shutters include at least one sealing device arranged on a top portion of the one or more shutters to minimize gas leakage through the one or more shutters.

26. The system of claim 25, wherein the at least one sealing device comprises at least one O-ring cord.

27. The system of claim 16, further comprising:
a linear actuator configured to open or close the two or more shutters.

28. The system of claim 27, wherein the linear actuator includes one or more suction hoses to prevent airborne contamination.

29. The system of claim 16, wherein the two or more shutters are coupled to the plate using shutter holders.

* * * * *